United States Patent

Tanaka et al.

[11] Patent Number: 6,150,196
[45] Date of Patent: Nov. 21, 2000

[54] METHOD OF MANUFACTURING AUTOMOBILE AC GENERATOR AND METHOD OF MANUFACTURING RECTIFIER USED IN AUTOMOBILE AC GENERATOR

[75] Inventors: Kazunori Tanaka; Kyoko Higashino; Katsumi Adachi, all of Tokyo, Japan

[73] Assignee: Mitsubishi Denki Kabushiki Kaisha, Tokyo, Japan

[21] Appl. No.: 09/136,618

[22] Filed: Aug. 20, 1998

[30] Foreign Application Priority Data

Jan. 30, 1998 [JP] Japan .................................. 10-018926

[51] Int. Cl.[7] .......................... H01L 21/44; H01L 21/50; H05K 3/00; H02K 11/00; H02K 1/32

[52] U.S. Cl. .......................... 438/122; 310/64; 310/68 D; 29/829; 29/831

[58] Field of Search .............................. 438/122; 310/64, 310/68 D; 29/829, 831

[56] References Cited

U.S. PATENT DOCUMENTS

| | | |
|---|---|---|
| 4,668,898 | 5/1987 | Harms et al. .......................... 318/254 |
| 5,095,235 | 3/1992 | Kitamura .............................. 310/68 D |
| 5,258,673 | 11/1993 | Gotoh . |
| 5,686,780 | 11/1997 | Adachi et al. ........................ 310/68 D |
| 5,729,063 | 3/1998 | Adachi et al. ........................ 310/68 D |
| 5,821,674 | 10/1998 | Weiner .................................. 310/68 D |
| 5,846,852 | 12/1998 | Limper-Brenner et al. ............ 438/118 |
| 5,977,669 | 11/1999 | Yoshida et al. ....................... 310/68 D |

*Primary Examiner*—Richard Booth
*Attorney, Agent, or Firm*—Sughrue, Mion, Zinn, Macpeak & Seas, PLLC

[57] ABSTRACT

First, a rectifier assembly is assembled from a negative heat sink assembly, a positive heat sink assembly, a circuit board assembly, and a guide. Subsequently, stator coil connecting terminals of the rectifier assembly are chucked by using a grounded chucking jig. Then, under this condition, powder coating charged with a plus polarity is sprayed to this rectifier assembly, and thus the sprayed powder coating is absorbed onto a surface of an exposed metal of the rectifier assembly by the electrostatic force. Thereafter, a heating process operation is carried out to heat/harden this powder coating, so that the insulating film is formed on the surface of the exposed metal of the rectifier assembly.

8 Claims, 9 Drawing Sheets

METHOD OF MANUFACTURING AUTOMOBILE AC GENERATOR AND METHOD OF MANUFACTURING RECTIFIER USED IN AUTOMOBILE AC GENERATOR

BACKGROUND OF THE INVENTION

1. Field of the Invention

The present invention is related to a method for manufacturing an automobile AC generator mounted on an engine of an automobile, and also to a method for manufacturing a rectifier applied to the automobile AC generator.

2. Description of the Related Art

FIG. 11 schematically shows a structure of an automobile AC generator.

In FIG. 11, a stator 1 is constructed of a stator core 2 and a stator coil 3 wound on this stator core 2. A rotator 4 is constituted by one pair of pole cores 5 and 6 located opposite to each other; an excitation coil 7 wound between the cores 5 and 6; a rotation shaft 8; and a slip ring 9 fixed on this rotation shaft 8. A front bracket 12 is provided with an intake port 12a and an exhaust port 12b, and a rear bracket 13 is provided with an intake port 13a and an exhaust port 13b. Then, the rear bracket 13 is fixed to the front bracket 12 by a fastening bolt 14, so that the stator 1 is supported between the front bracket 12 and the rear bracket 13. The rotation shaft 8 is supported via bearings 15 and 16 by the front bracket 12 and the rear bracket 13.

A pulley 17 is fixed to one end of the rotation shaft 8. A rectifier 18 is mounted on the rear bracket 13, and is electrically connected to an output terminal of the stator coil 3 so as to convert AC power generated from the stator 1 into DC power. A voltage regulator 19 is mounted to the rear bracket 13 in connection with a brush holder 20. The brush holder 20 supports a brush 21 in such a manner that this brush 21 abuts against the slip ring 9.

In the automobile AC generator constituted in the above-described manner, a current is supplied via the brush 21 and the slip ring 9 to the excitation coil 7, and at the same time, rotation torque of an engine is transported via the pulley 17 and a belt (not shown) to the rotation shaft 8, so that the rotator 4 is rotary-driven. As a result, the stator 1 may generate AC power. Then, this AC power is converted into DC power by the rectifier 18.

This automobile AC generator is mounted on the engine of the automobile for use purposes. Generally speaking, this automobile AC generator is used under very severe conditions, for instance, water, salty water, muddy water and the like are entered from the air intake holes 12a, 13a and the exhaust holes 12b, 13b into this generator. Also, this generator is exposed at high ambient temperatures. Therefore, the exposed metal portions of the structural components employed in the automobile AC generator are treated by the insulating process in order to achieve the following performance even under such severe use conditions. By this performance, the insulating characteristic of the insulated portions are not deteriorated, but also the power generation failure does not occur.

In particular, although not shown in the drawing, the rectifier 18 is constituted by the positive heat sink equipped with a plurality of positive diodes, the negative heat sink equipped with a plurality of negative diodes, and the circuit board. Thus, this rectifier 18 owns a complex three-dimensional shape. If the insulating process step is combined with the automatic assembling process step, then it is practically difficult to firmly insulating-coat the exposed surfaces of the metals such as the heat sinks, the diode connection terminals, and the voltage regulator connecting terminal while this rectifier 18 is assembled, because of such a complex shape of this rectifier 18. Therefore, conventionally, the exposed metal surfaces of the positive heat sink, the negative heat sink, and the circuit board are individually insulating-coated by the manual manner. Otherwise, the exposed metal surfaces of the positive heat sink and of the negative heat sink, to which the diodes are mounted, are manually insulating-coated under assembly condition.

As previously explained, the manual insulating coating process is carried out in the conventional rectifier used in the automobile AC generator in the following manners. That is, the exposed metal surfaces of the positive heat sink, the negative heat sink, and the circuit board are individually insulating-coated by the manual steps. Otherwise, the exposed metal surfaces of the positive heat sink and of the negative heat sink, to which the diodes are mounted, are manually insulating-coated under assembly condition. The portions other than the finally exposed portions in the conventional rectifier, namely the component mounting contact surfaces must be masked during this insulating coating process. Accordingly, there are problems that the working operations become cumbersome, and a total number of working steps is increased.

Also, in order to increase the heat radiating areas of the heat sinks, these heat sinks should have very complex concave/convex shapes. Thus, the insulating film could not be uniformly coated on the surfaces of these heat sinks. In particular, clogging, or plugging of the coating would occur among the heat radiation fins. As a result, there is another problem that the insulating films having high quality could not be formed.

SUMMARY OF THE INVENTION

The present invention has been made to solve the above-described problems, and therefore, has an object to provide a method for manufacturing a rectifier and also a method for manufacturing an automobile AC generator, capable of forming an insulating film with a high quality by coating an insulating film on an exposed metal portion thereof by way of a charged powder coating manner, resulting in an improvement of work ability and a reduction of working steps.

To achieve the above-described object, a method for manufacturing a rectifier of an automobile AC generator, according to an aspect of the present invention, is featured by comprising: a step for assembling a rectifier assembly constituted by a positive heat sink assembly manufactured by mounting a plurality of positive diodes on a positive heat sink, a negative heat sink assembly manufactured by mounting a plurality of negative diodes on a negative heat sink, and a circuit board assembly; a powder coating spraying step in which the rectifier assembly is held by a chucking jig, the rectifier assembly is grounded, and then insulating powder coating charged with a plus polarity is sprayed to the rectifier assembly, whereby the insulating powder coating being absorbed onto a surface of an exposed metal of the rectifier assembly by the electrostatic force; and a heating process step for heating the powder coating to be hardened, which is covered on the surface of the exposed metal.

Also, a method for manufacturing an automobile AC generator, according to another aspect of the present invention, is featured by comprising: a step for assembling a rectifier assembly constituted by a positive heat sink assembly manufactured by mounting a plurality of positive diodes on a positive heat sink, a negative heat sink assembly manufactured by mounting a plurality of negative diodes on a negative heat sink, and a circuit board assembly; a step for assembling the rectifier assembly to a rear bracket; a powder coating spraying step in which the rectifier assembly and the rear bracket are grounded, and then insulating powder coating charged with a plus polarity is sprayed to the rectifier assembly and the rear bracket, whereby the insulating powder coating being absorbed onto a surface of an exposed metal of the rectifier assembly and the rear bracket by the electrostatic force; and a heating process step for heating the powder coating to be hardened, which is covered on the surface of the exposed metal.

BRIEF DESCRIPTION OF THE DRAWINGS

For a better understanding of the present invention, reference is made of a detailed description to be read in conjunction with the accompanying drawings, in which.

DETAILED DESCRIPTION OF THE PREFERRED EMBODIMENTS

Referring now to drawings, various preferred embodiments according to the present invention will be described in detail.

EMBODIMENT MODE 1

Figure 1:
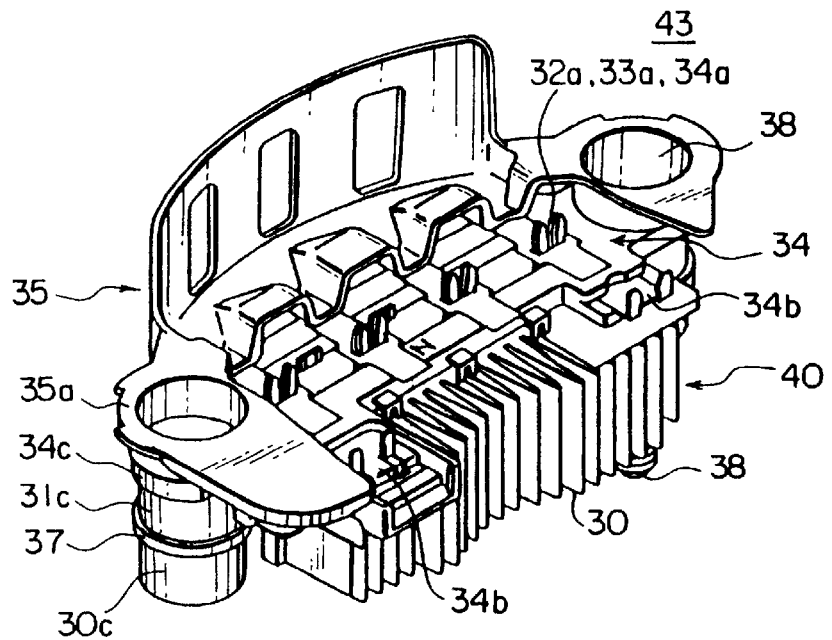
FIG. 1 is a perspective view for indicating a rectifier assembly in a rectifier manufacturing method according to a first embodiment mode of the present invention.
Figure 2:
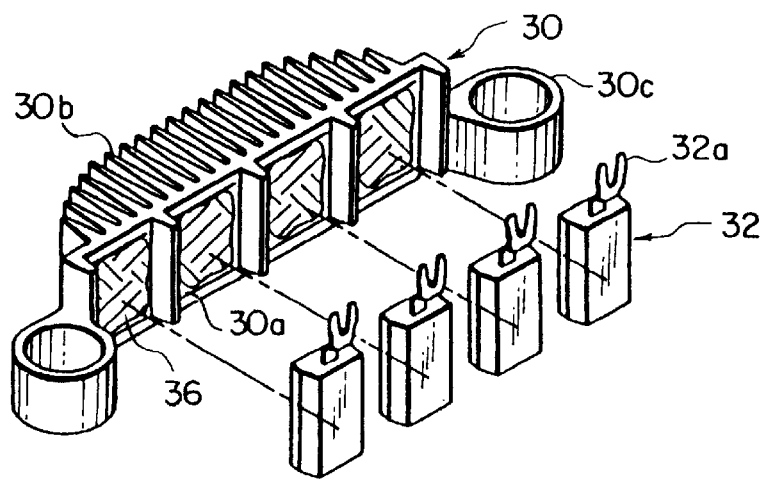
FIG. 2 is an exploded perspective view for showing a negative heat sink assembly which constitutes the rectifier assembly indicated in FIG. 1.
Figure 3:
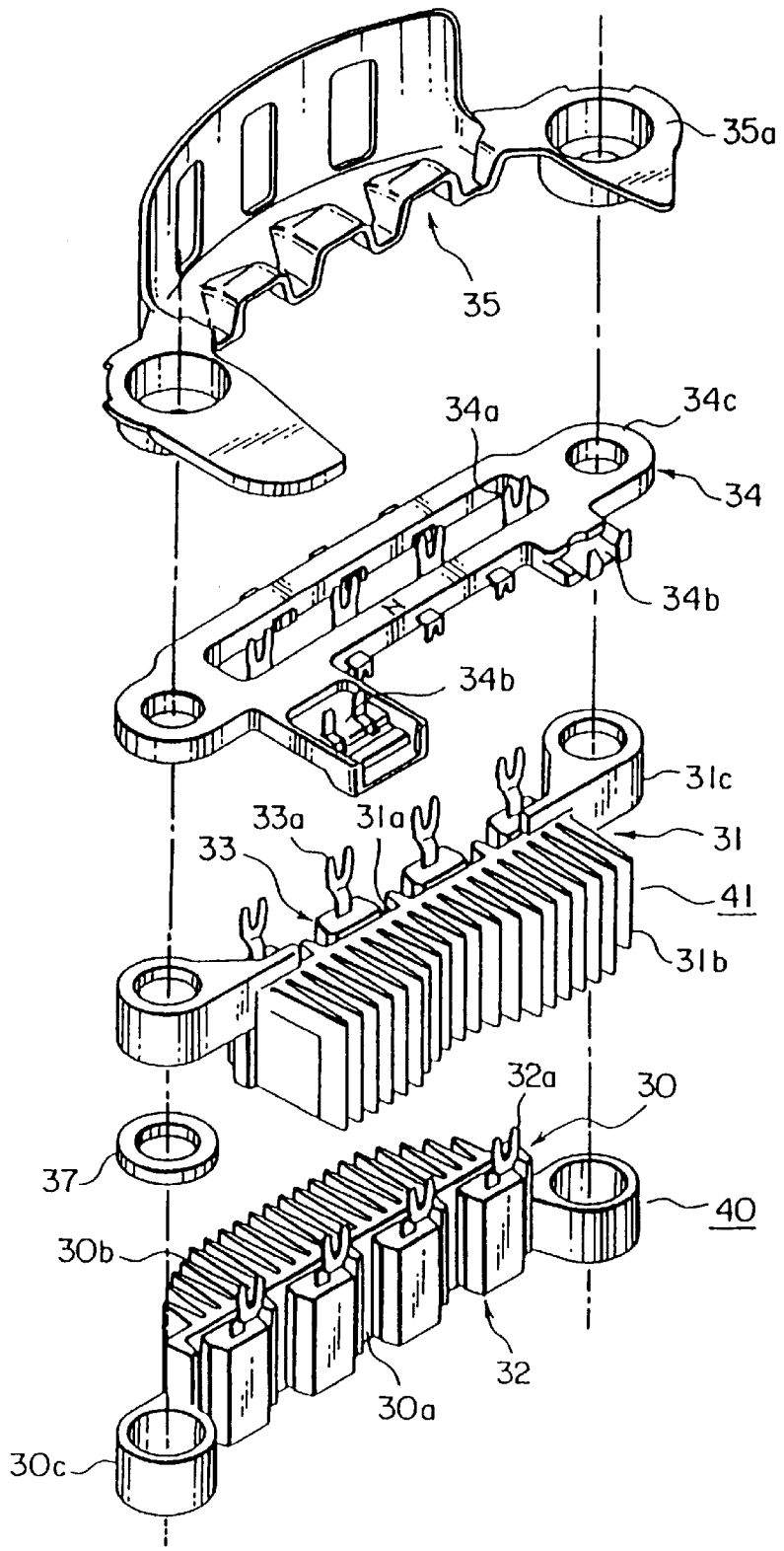
FIG. 3 is an exploded perspective view for showing the rectifier assembly of FIG. 1.
Figure 4:
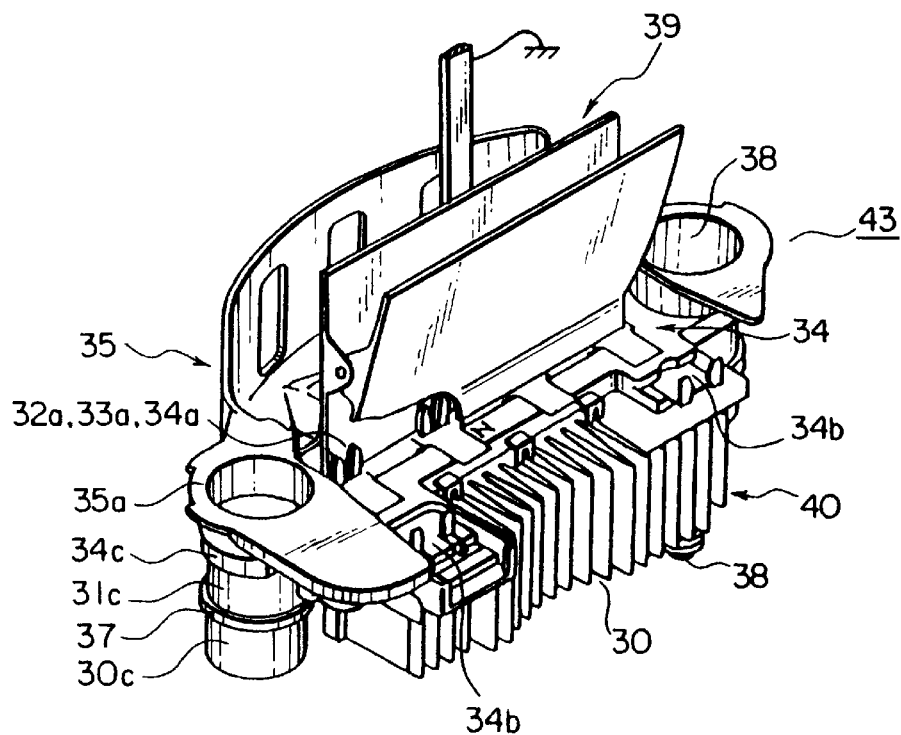
FIG. 4 is a perspective view for indicating a chucking state of the rectifier assembly in the method for manufacturing the rectifier according to the first embodiment mode of the present invention.

FIG. 1 is a perspective view for indicating a rectifier assembly with respect to a method for manufacturing a rectifier according to an embodiment mode 1 of the present invention. FIG. 2 is an exploded perspective view for showing a negative heat sink assembly which constitutes the rectifier assembly indicated in FIG. 1. FIG. 3 is an exploded perspective view for showing the rectifier assembly of FIG. 1. FIG. 4 is a perspective view for indicating a chucking state of the rectifier assembly in the method for manufacturing the rectifier according to the embodiment mode 1 of the present invention.

In FIG. 1 to FIG. 4, a negative heat sink 30 is made of aluminum, and contains a plurality of negative diode mounting portions 30a, a plurality of heat radiation fins 30b, and one pair of annular guide portions 30c. A positive heat sink 31 is made of aluminum, and contains a plurality of positive diode mounting portions 31a, a plurality of heat radiation fins 31b, and one pair of annular guide portions 31c. A negative diode 32 is constructed by molding an IC chip with resin, and has a projected stator coil connecting terminal 32a. A positive diode 33 is constructed by molding an IC chip with resin and owns a projected stator coil connecting terminal 33a. A circuit board assembly 34 is manufactured in such a manner that a circuit board is molded by polyphenylene sulfide (PPS) resin, and contains a plurality of projected stator coil connecting terminals 34a, one pair of voltage regulator connecting terminals 34b, and one pair of annular guide portions 34c. A guide 35 is made of PPS resin, and owns one pair of annular guide portions 35a. A metal chucking jig 39 is employed so as to hold a rectifier assembly 43, and is connected to the ground.

Next, a description will now be made of a method for manufacturing the rectifier according to this embodiment mode 1.

First, the negative diode 32 is joined to each of the negative diode mounting portions 30a of the negative heat sink 30 by way of solder 36, so that, as shown in FIG. 2, a negative heat sink assembly 40 is assembled. Similarly, the positive diode 34 is joined to each of the positive diode mounting portions 31a of the positive heat sink 31 by way of solder, so that a positive heat sink assembly 41 is assembled.

Subsequently, the negative heat sink assembly 40, positive heat sink assembly 41, the circuit board assembly 34, and the guide 35 are overlapped with each other by guiding the guide portions thereof. A bolt 38 is inserted into holes of the guide portions under pressure so as to form these components in an integral body. Thus, as indicated in FIG. 1, a rectifier assembly 43 is assembled. In this rectifier assembly 43, an insulating ring 37 is interposed between the guide portions 30c and 31c to secure electric insulation between the negative heat sink 30 and the positive heat sink 31. Also, the stator coil connecting terminals 32a, 33a, 34a of the negative heat sink assembly 40, the positive heat sink assembly 41, and the circuit board assembly 34 are overlapped with each other to constitute a connection portion for the stator coil 3.

Both an edge surface of the guide portion 30c of the rectifier assembly 43 assembled in this manner and the voltage regulator connecting terminal 34b are masked.

Then, as shown in FIG. 4, the connection portion for the stator coil 3 is chucked by a chucking jig 39 connected to the earth. Under this condition, powder coating (paint) charged by friction is sprayed to the rectifier assembly 43. As a result, the powder coating charged with a plus polarity is sprayed to exposed metal surfaces including portions which are hidden by being overlapped with non-metal components. Thereafter, the rectifier assembly 43 is treated by a heating process operation so as to heat/harden the powder coating, so that the rectifier, the exposed metal surfaces of which are insulated/covered by the powder coating, can be obtained.

As previously described, in accordance with this embodiment mode 1, since the rectifier assembly 43 itself is treated by the insulating process operation, the insulating process work can be simplified and a total step number of this insulating process work can be reduced. At the same time, this insulating process step may be combined with an automatic assembling step, and therefore productivity may be increased.

Also, since the powder coating charged at the plus polarity is sprayed to the rectifier assembly 43, a metal portion of which is grounded, so as to coat the powder coating thereon, this powder coating can also be sprayed to such a portion hidden by being overlapped with the non-metal component. As a result, it is possible to realize the insulating process operation with a high quality.

Also, since the connection portion for the stator coil 3 is chucked by the chucking jig 39 connected to the earth, there is no need to mask the connection portion for the stator coil 3. As a result, the work ability can be increased and no longer the earth jig is required.

Now, a description will be made of powder coating by a powder friction charging system applied to the present invention.

The powder coating is made from, for example, insulating powder made of epoxy resin, the particle diameters of which are made constant. Then, after this powder coating has been charged with the plus polarity through a spray pipe made of Teflon (tradename), the charged powder coating is sprayed to the rectifier assembly 43. As a result, the plus-charged powder particles are absorbed to a metal surface connected to the earth by way of electrostatic force, so that the powder coating may cover not only a portion having a complex shape, but also a hidden portion, and thus no pin hole is made.

Since the particle diameters of this powder coating is made constant, energy owned by the respective powder particles can be made uniform. Also, since the powder particles are absorbed onto the metal surface by the electrostatic force, the powder particles having thickness larger than or equal to a preselected thickness are not absorbed. Accordingly, the powder coating can be coated with having the uniform thickness.

This thickness of the coating film may give an influence to the heat radiation characteristics of the negative heat sink 30 and the positive heat sink 31. Therefore, while the particle diameters (thickness of coating film) of the powder particles are varied, the heat radiation characteristics of the heat sinks are investigated. The investigation result is shown in FIG. 5.

Figure 5:
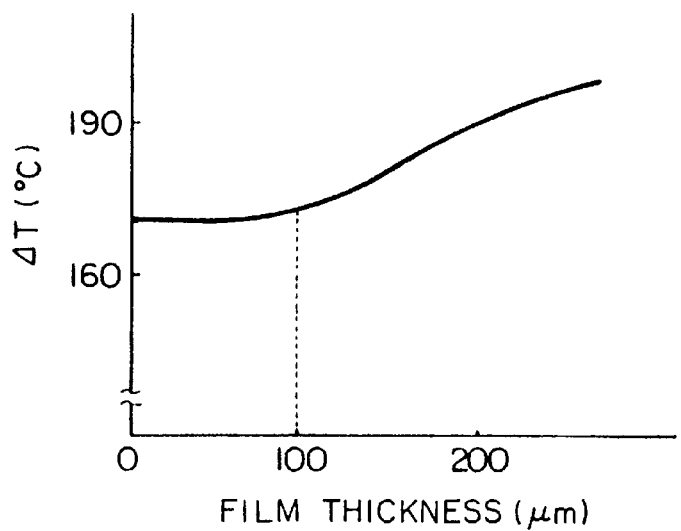
FIG. 5 graphically represents a relationship between a heat radiation characteristic and a coating film made by powder coating applicable to the present invention.

As apparent from FIG. 5, when the thickness of the coating film exceeds 100 $\mu$m, the heat radiation characteristic is rapidly lowered. Then, when a central value of distribution of the powder particle diameters becomes large, the thickness of the coating film becomes thick. On the other hand, when a central value of distribution of the powder particle diameters becomes small, the thickness of the coating film becomes thin. The experiment could unveil such a fact that a coating film having a thickness smaller than or equal to 100 $\mu$m could be manufactured by adjusting the central value of the particle diameter distribution to 20 $\mu$m through 40 $\mu$m. Also, while the central value of the particle diameter distribution was selected to be 20 to 40 $\mu$m and the thickness of the coating film was made less than 100 $\mu$m, the powder coating could be sprayed without any plugging, or clogging to such a heat sink that a mutual distance between surfaces of a heat radiation fins was selected to be 1 to 1.5 mm.

As a consequence, the particle diameters of the powder coating are preferably adjusted in such a manner that the central value of the particle diameter distribution is selected to be 20 to 40 $\mu$m.

It should be noted that the shape of the heat radiation fin of the heat sink is not limited to the shape shown in the drawings, but also may be varied, for instance, a circular shape and an ellipse shape if the fin height is 10 times larger than the fin mutual distance.

EMBODIMENT MODE 2

Figure 6:
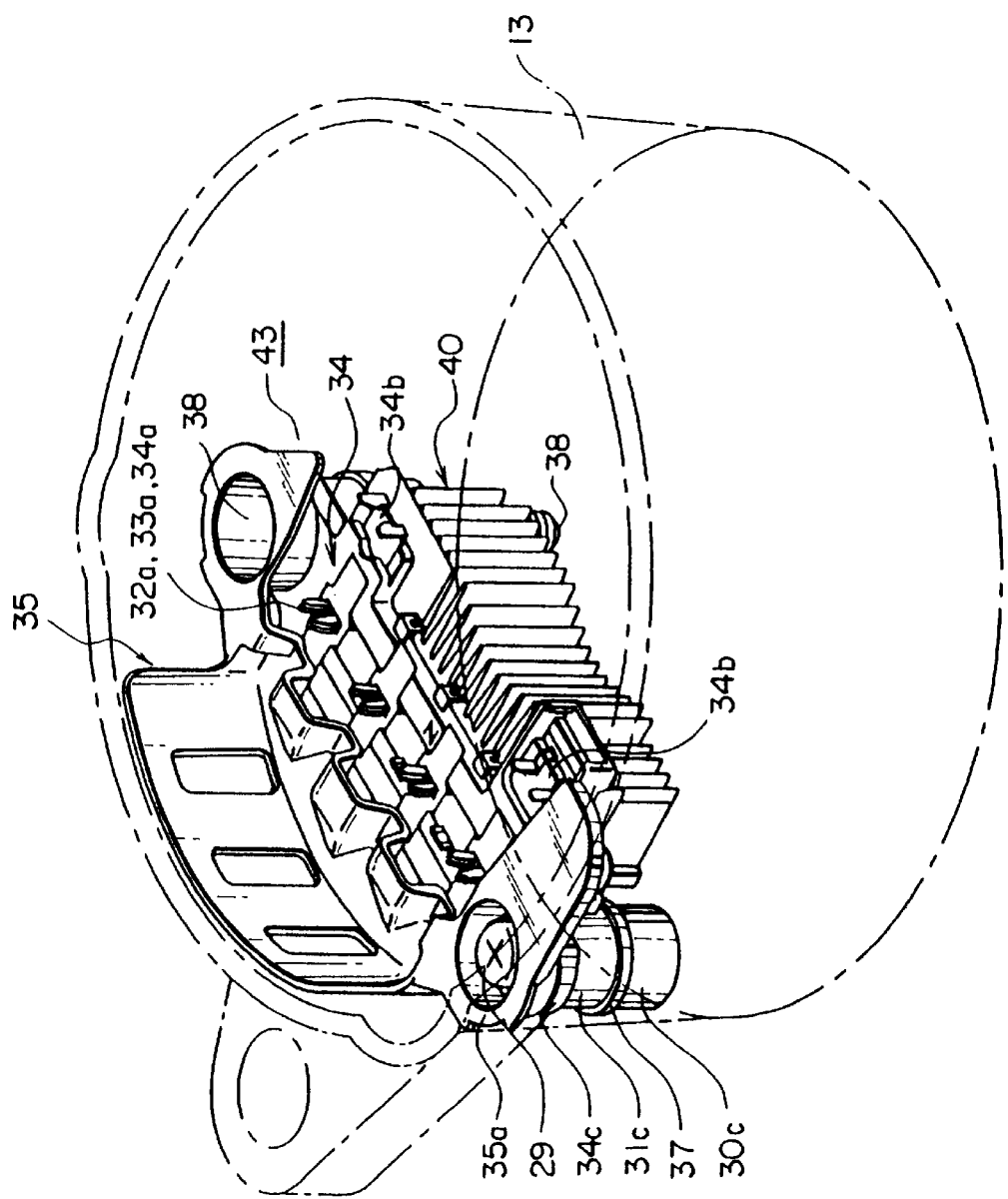
FIG. 6 is a perspective view for explaining a method for manufacturing an automobile AC generator according to a second embodiment mode of the present invention.
Figure 7:
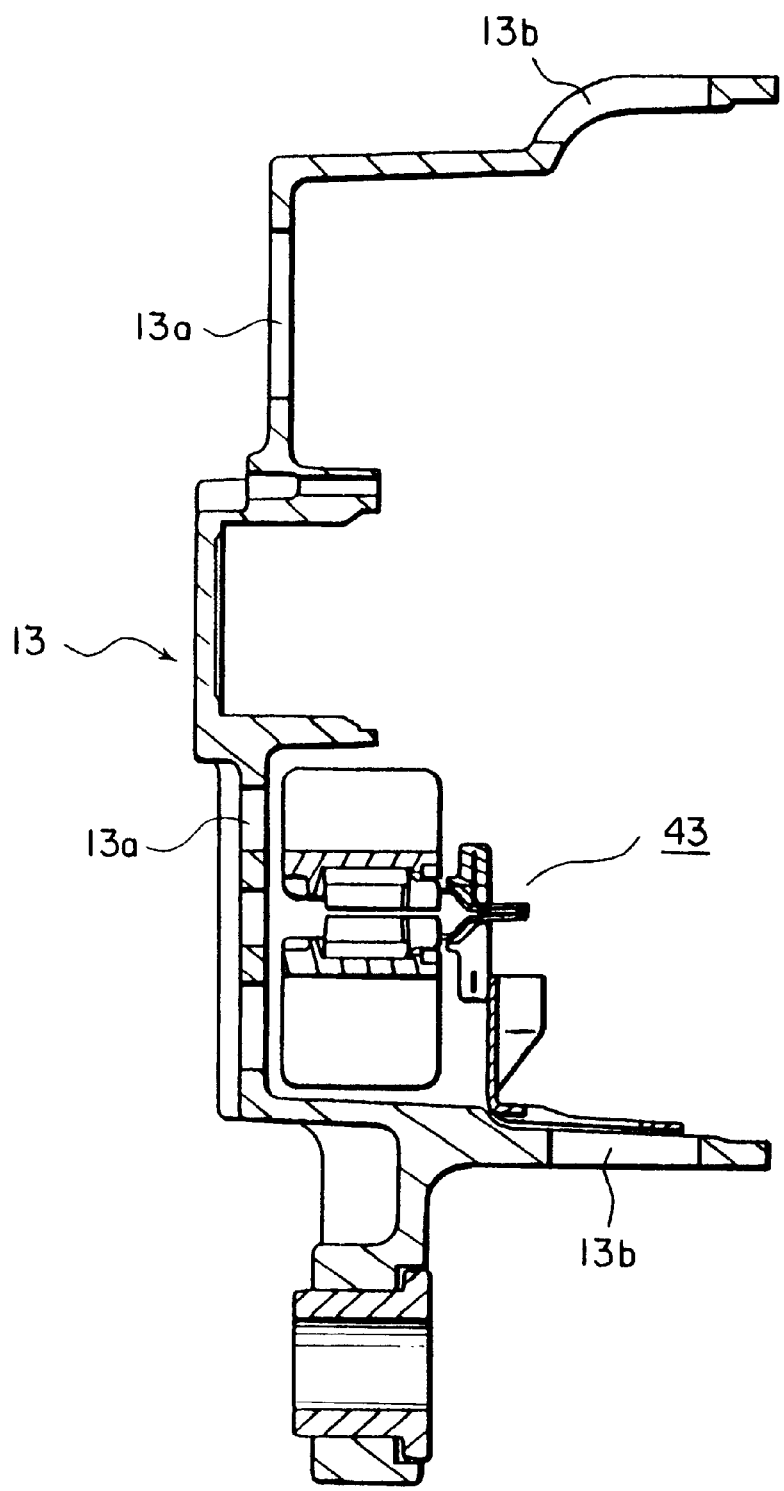
FIG. 7 is a sectional view for explaining a method for manufacturing an automobile AC generator according to the second embodiment mode of the present invention.

FIG. 6 and FIG. 7 are a perspective view and a sectional view, used to explain a method for manufacturing an automobile AC generator, according to an embodiment mode 2 of the present invention.

First, in this embodiment mode 2, the rectifier assembly 43 is assembled in accordance with the sequential operation as explained in the embodiment mode 1. Then, the voltage regulator connecting terminal 34b of this rectifier assembly 43 is masked. Subsequently, this rectifier assembly 43 is arranged at a predetermined position of a rear bracket 13, and a mounting bolt 29 is inserted into a hole of a guide portion provided on one side of this rectifier assembly 43 so as to fasten this rectifier assembly 43 to the rear bracket 13. As a result, the rectifier assembly 43 is mounted under such a condition that an edge surface of the guide portion 30c of the negative heat sink 30 abuts against the rear bracket 13, and thus this rectifier assembly 43 is electrically connected to the rear bracket 13.

Then, the connection portion of the rectifier assembly 43 for the stator coil 3 is chucked by the chucking jig 39 connected to the earth. Under this condition, powder coating (paint) charged by friction is sprayed to the rectifier assembly 43 and the rear bracket 13. As a result, the powder coating charged with a plus polarity is sprayed to the exposed metal surfaces including portions which are hidden by being overlapped with the non-metal components. Thereafter, the rectifier assembly 43 and the rear bracket 13 are treated by a heating process operation so as to heat/harden the powder coating, so that the rectifier, the exposed metal surfaces of which are insulated/covered by the powder coating, can be obtained.

As previously described, in accordance with this embodiment mode 2, since the rectifier assembly 43 under such a condition that it is mounted with the rear bracket 13 is treated by the insulating process operation, the insulating process work can be simplified. Moreover, the masking work for the edge surface of the guide portion 30c of the negative heat sink 30 is not required, and a total step number of this insulating process work can be reduced. At the same time, this insulating process step may be combined with an automatic assembling step, and therefore productivity may be increased.

Also, since the powder coating charged at the plus polarity is sprayed to the rear bracket 13 and the rectifier assembly 43, a metal portion of which is grounded, so as to coat the powder coating thereon, this powder coating can also be sprayed to such a portion hidden by being overlapped with the non-metal component. As a result, it is possible to realize the insulating process operation with a high quality.

Also, since the connection portion for the stator coil 3 is chucked by the chucking jig 39 connected to the earth, there is no need to mask the connection portion for the stator coil 3. As a result, the work ability can be increased and no longer the earth jig is required.

EMBODIMENT MODE 3

Figure 8:
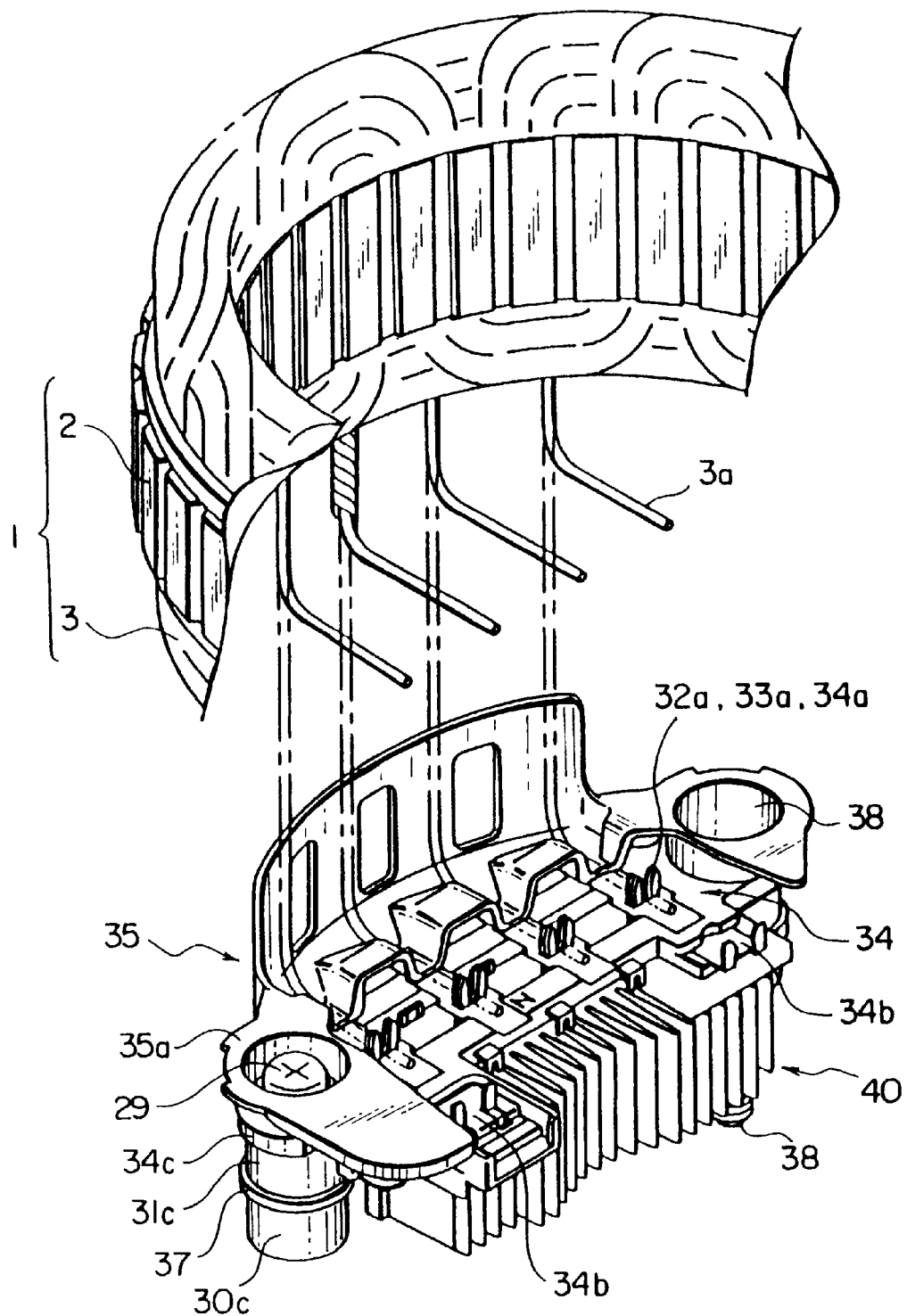
FIG. 8 is a perspective view for explaining a method for manufacturing an automobile AC generator according to a third embodiment mode of the present invention.
Figure 9:
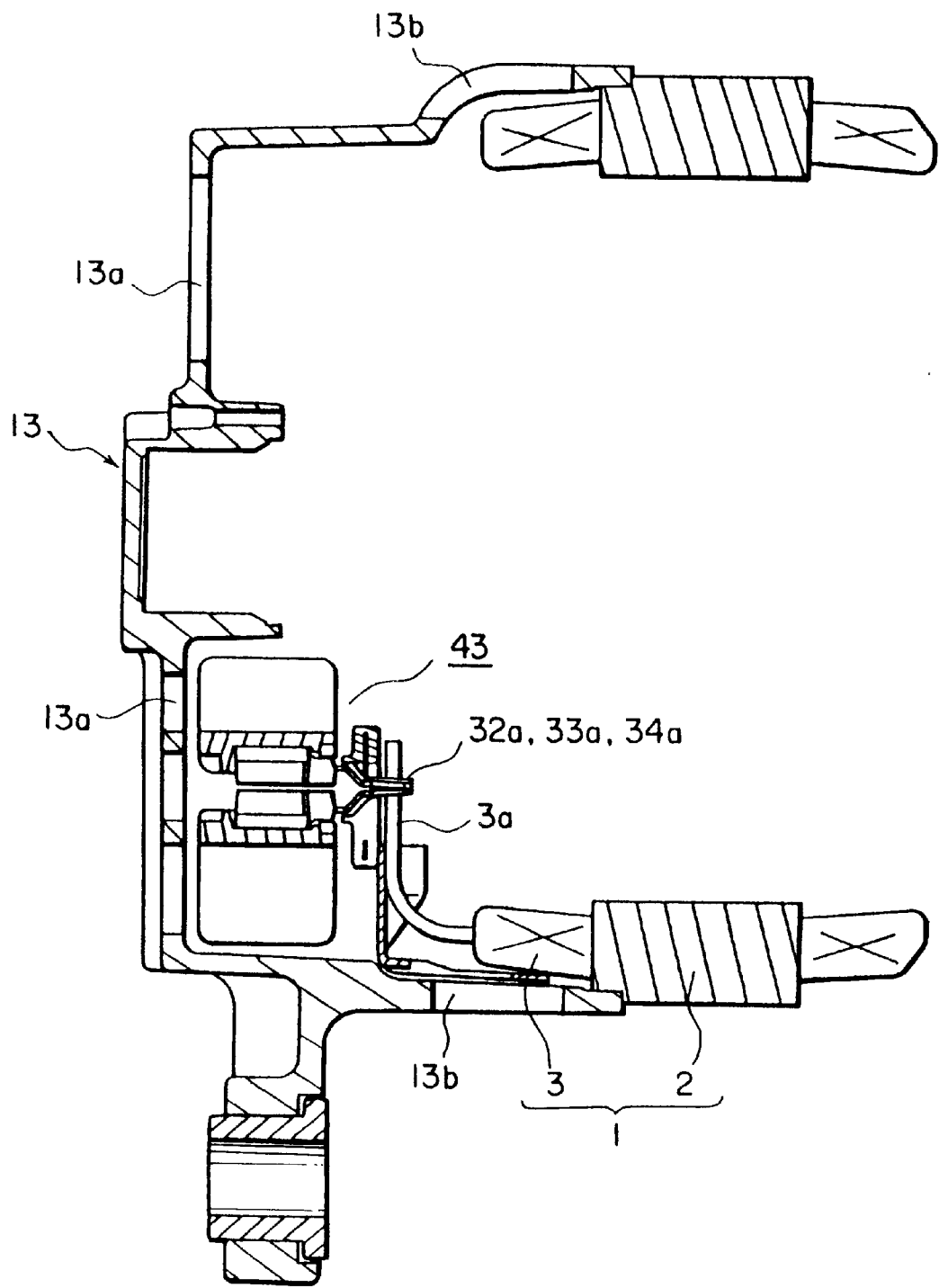
FIG. 9 is a sectional view for explaining a method for manufacturing an automobile AC generator according to the third embodiment mode of the present invention.

FIG. 8 and FIG. 9 are a perspective view and a sectional view, used to explain a method for manufacturing an automobile AC generator, according to an embodiment mode 3 of the present invention.

First, in this embodiment mode 3 the rectifier assembly 43 is assembled in accordance with the sequential operation as explained in the embodiment mode 1. Then, the voltage regulator connecting terminal 34b of this rectifier assembly 43 is masked. Subsequently, this rectifier assembly 43 is arranged at a predetermined position of the rear bracket 13, and the mounting bolt 29 is inserted into the hole of the guide portion provided on one side of this rectifier assembly 43 so as to fasten this rectifier assembly 43 to the rear bracket 13. As a result, the rectifier assembly 43 is mounted under such a condition that an edge surface of the guide portion 30c of the negative heat sink 30 abuts against the rear bracket 13, and thus this rectifier assembly 43 is electrically connected to the rear bracket 13.

Furthermore, the stator 1 is inserted into the rear bracket 13 under pressure. Then, a lead 3a extended from the stator coil 3 is connected to the connection portion of the rectifier assembly 43 for the rectifier coil 3. At this time, the respective stator coil connecting terminals 32a, 33a, 34a of the negative heat sink assembly 40, the positive heat sink assembly 41, and the circuit board assembly 34 are formed in the same shape capable of sandwiching the lead 3a. After this lead 3a has been sandwiched by the connection terminals 32a, 33a, 34a, the lead 3a is soldered.

Next, a portion of a metal is chucked by the chucking jig 39 connected to the earth. Under this condition, powder coating (paint) charged by friction is sprayed to the rectifier assembly 43, the stator 1, and the rear bracket 13. As a result, the powder coating charged with the plus polarity is sprayed to the exposed metal surfaces including the portions which are hidden by being overlapped with non-metal components. Thereafter, the rectifier assembly 43, the stator 1, and the rear bracket 13 are treated by a heating process operation so as to heat/harden the powder coating, so that the rectifier, the exposed metal surfaces of which are insulated/covered by the powder coating, can be obtained.

As a consequence, this embodiment mode 3 may have a similar effect to that of the above-described embodiment mode 2.

Moreover, in accordance with this embodiment mode 3, both the edge surface of the guide portion 30c of the negative heat sink 30 and the connection portion for the stator coil 3 are no longer masked, so that a total step number of the work operation can be reduced.

Also, since the insulating process operations are simultaneously carried out with respect to the soldering connection portion between the stator coil 3 and the rectifier assembly 43, the terminal of the stator coil, and a stator core 2, the insulating process works for the exposed metal surfaces which will be executed in the later step can be simplified.

EMBODIMENT MODE 4

Figure 10:
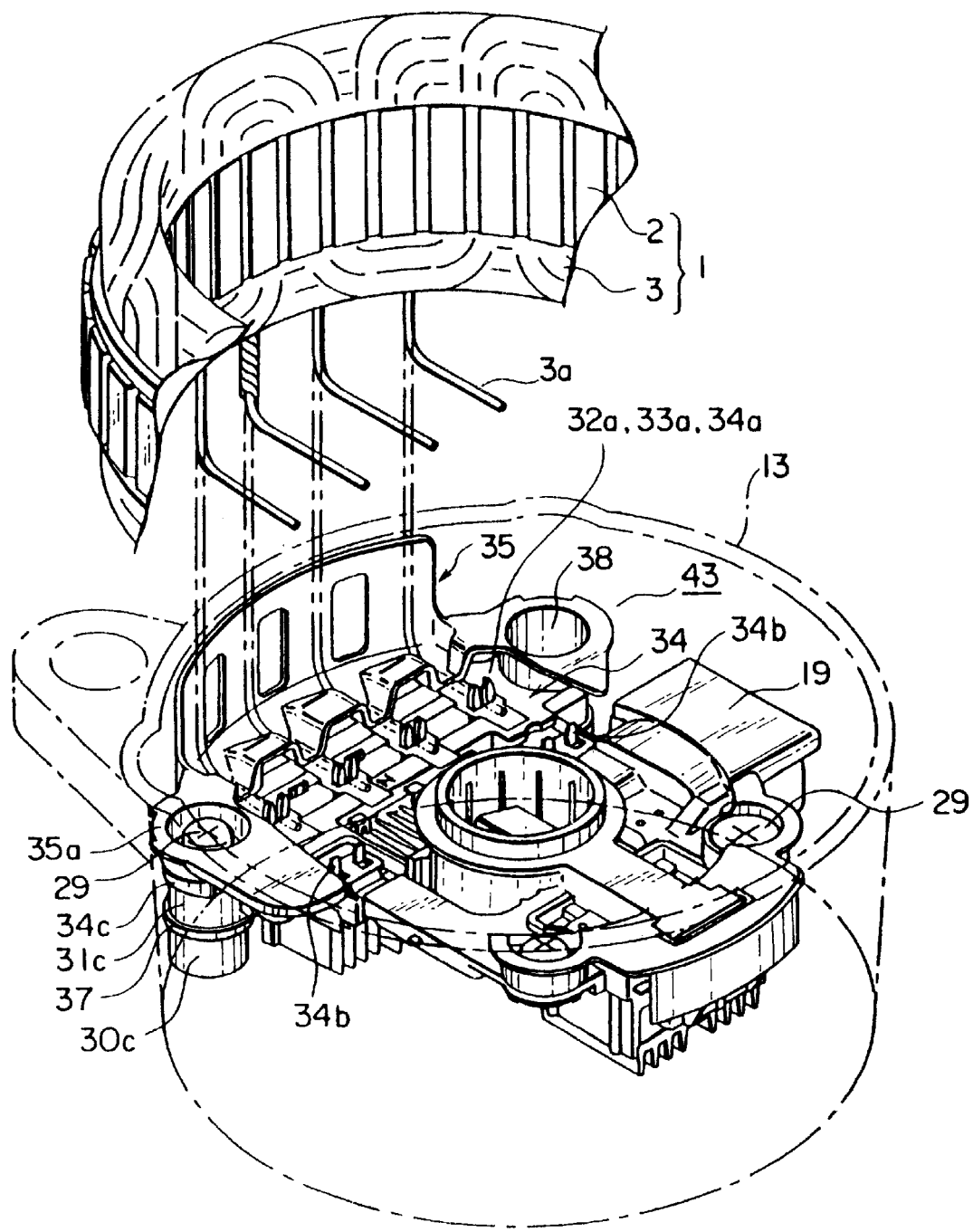
FIG. 10 is a perspective view for explaining a method for manufacturing an automobile AC generator according to a fourth embodiment mode of the present invention.
Figure 11:
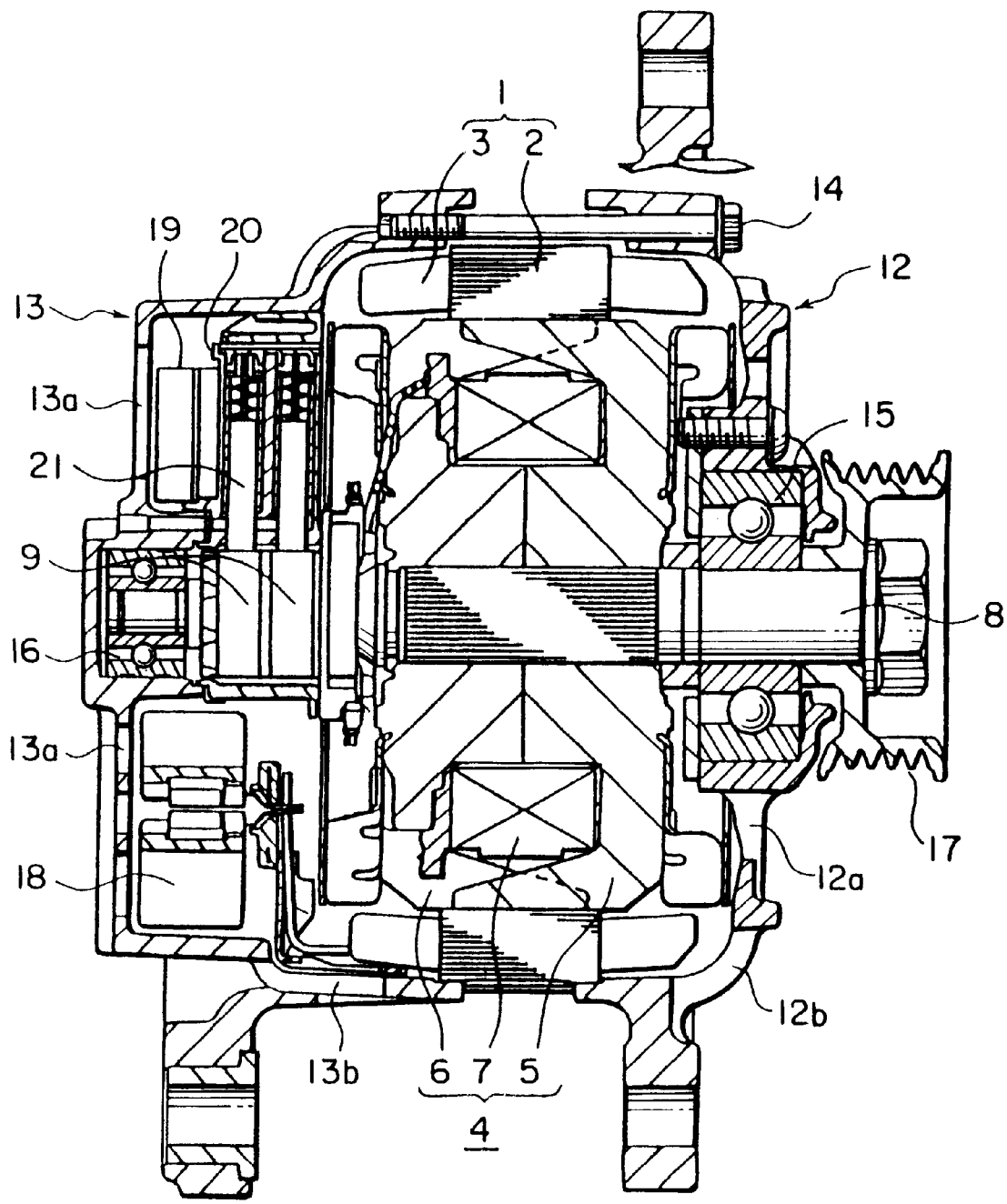
FIG. 11 is a structural diagram for showing the automobile AC generator.

FIG. 10 is a perspective view used to explain a method for manufacturing an automobile AC generator, according to an embodiment mode 4 of the present invention.

First, in this embodiment mode 4, the rectifier assembly 43 is assembled in accordance with the sequential operation as explained in the embodiment mode 1. Subsequently, this rectifier assembly 43 is arranged at a predetermined position of the rear bracket 13, and the mounting bolt 29 is inserted into the hole of the guide portion provided on one side of this rectifier assembly 43 so as to fasten this rectifier assembly 43 to the rear bracket 13. As a result, the rectifier assembly 43 is mounted under such a condition that an edge surface of the guide portion 30c of the negative heat sink 30 abuts against the rear bracket 13, and thus this rectifier assembly 43 is electrically connected to the rear bracket 13.

Next, the voltage regulator 19 is arranged at a preselected position of the rear bracket 13, and the mounting bolt 29 is fastened to the rear bracket 13 so as to be mounted. Then, a terminal of the voltage regulator 19 is soldered to the voltage regulator connecting terminal 34b.

Furthermore, the stator 1 is inserted into the rear bracket 13 under pressure. Then, the lead 3a extended from the stator coil 3 is soldered to the connection portion of the rectifier assembly 43 for the stator coil 3.

Subsequently, a portion of a metal is chucked by the chucking jig 39 connected to the earth. Under this condition, powder coating (paint) charged by friction is sprayed to the rectifier assembly 43, the stator 1, the voltage regulator 19, and the rear bracket 13. As a result, the powder coating charged with the plus polarity is sprayed to the exposed metal surfaces including portions which are hidden by being overlapped with the non-metal components. Thereafter, the rectifier assembly 43, the stator 1, the voltage regulator 19, and the rear bracket 13 are treated by the heating process operation so as to heat/harden the powder coating, so that the rectifier, the exposed metal surfaces of which are insulated/covered by the powder coating, can be obtained.

As a consequence, this embodiment mode 4 may have a similar effect to that of the above-described embodiment mode 2.

Moreover, in accordance with this embodiment mode 4, the edge surface of the guide portion 30c of the negative heat sink 30, the connection portion for the stator coil 3 and the voltage regulator connecting terminal 34b are no longer masked, so that the masking work of the rectifier assembly 43 can be omitted.

Also, since the insulating process operations are simultaneously carried out with respect to the soldering connection portion between the stator coil 3 and the rectifier assembly 43, the soldering connection portion between the voltage regulator 19 and the rectifier assembly 43, the terminal of the stator coil 3, and further the soldering surface peripheral portions within the stator core 2 and the voltage regulator 19, the insulating process works for the exposed metal surfaces which will be executed in the later step can be considerably simplified. As a consequence, deterioration of the insulating portion and the occurrence of the power generation failure can be suppressed, so that the automobile AC generator with highly reliable characteristics can be manufactured.

Since the present invention has been constructed in the above-described manner, there are the below-mentioned effects.

In accordance with the present invention, the method for manufacturing the rectifier of the automobile AC generator is comprised of: the step for assembling the rectifier assembly constituted by the positive heat sink assembly manufactured by mounting a plurality of positive diodes on the positive heat sink, the negative heat sink assembly manufactured by mounting a plurality of negative diodes on the negative heat sink, and the circuit board assembly; the powder coating spraying step in which the rectifier assembly is held by the chucking jig, the rectifier assembly is grounded, and then insulating powder coating charged with the plus polarity is sprayed to the rectifier assembly, whereby the insulating powder coating being absorbed onto a surface of an exposed metal of the rectifier assembly by the electrostatic force; and the heating process step for heating the powder coating to be hardened, which is covered on the surface of the exposed metal. As a consequence, the insulating film with the high quality can be formed on the exposed metal surface, the work ability can be improved, and the total working step number can be reduced.

Also, since the stator coil connecting terminal of the rectifier assembly is earthed, the stator coil connecting terminal is no longer masked, so that the resultant working step number can be reduced.

Also, since the chucking jig is connected to the earth, and the stator coil connecting terminal is chucked by the chucking jig, whereby the stator coil connecting terminal being earthed, no earth jig is required.

Further, according to the present invention, the method for manufacturing the automobile AC generator is comprised of: the step for assembling a rectifier assembly constituted by the positive heat sink assembly manufactured by mounting a plurality of positive diodes on the positive heat sink, the negative heat sink assembly manufactured by mounting a plurality of negative diodes on the negative heat sink, and the circuit board assembly; the step for assembling the rectifier assembly to the rear bracket; the powder coating spraying step in which the rectifier assembly and the rear bracket are grounded, and then the insulating powder coating charged with a plus polarity is sprayed to the rectifier assembly and the rear bracket, whereby the insulating powder coating being absorbed onto a surface of an exposed metal of the rectifier assembly and the rear bracket by the electrostatic force; and the heating process step for heating the powder coating to be hardened, which is covered on the surface of the exposed metal. As a consequence, the insulating film with the high quality can be formed on the exposed metal, surface, the work ability can be improved, and the total working step number can be reduced. Furthermore, the insulating process work for the exposed metal surface, which will be executed in the later stage, can be simplified.

Also, the method for manufacturing the automobile AC generator is further comprised of: prior to the powder coating spraying step, the step for assembling the stator to the rear bracket, and for electrically connecting the stator coil to the stator coil connecting terminal of the rectifier assembly. As a consequence, the masking work step number of the rectifier assembly can be reduced, and the insulating process work of the exposed metal surface, which will be executed in the later step, can be simplified.

Also, the method for manufacturing the automobile AC generator is further comprised of: prior to the powder coating spraying step, the step for assembling the voltage regulator and the stator to the rear bracket, for electrically connecting the voltage regulator to the voltage regulator connecting terminal of the rectifier assembly, and for electrically connecting the stator coil to the stator coil connecting terminal of the rectifier assembly. As a consequence, the masking work step number of the rectifier assembly can be omitted, and the insulating process work of the exposed metal surface, which will be executed in the later step, can be considerably simplified.

Also, since the powder particle diameter of the powder coating is adjusted to be 20 to 40 $\mu$m, the uniform insulating coating without any pin hole can be formed on the exposed metal surface, while maintaining the heat radiation characteristic.

What is claimed is:

1. A method for manufacturing a rectifier of an automobile AC generator, comprising:

a step for assembling a rectifier assembly constituted by a positive heat sink assembly manufactured by mounting a plurality of positive diodes on a positive heat sink, a negative heat sink assembly manufactured by mounting a plurality of negative diodes on a negative heat sink, and a circuit board assembly;

a powder coating spraying step in which said rectifier assembly is held by a chucking jig, said rectifier assembly is grounded, and then insulating powder coating charged with a plus polarity is sprayed to said rectifier assembly, whereby said insulating powder coating being absorbed onto a surface of an exposed metal of said rectifier assembly by the electrostatic force; and a heating process step for heating the powder coating to be hardened, which is covered on the surface of said exposed metal.

2. A method for manufacturing a rectifier of an automobile AC generator as recited in claim 1 wherein:

a stator coil connecting terminal of said rectifier assembly is earthed.

3. A method for manufacturing a rectifier of an automobile AC generator as recited in claim 2 wherein:

said chucking jig is connected to the earth and said stator coil connecting terminal is chucked by said chucking jig, whereby said stator coil connecting terminal being earthed.

4. A method for manufacturing a rectifier of an automobile AC generator as recited in claim 1 wherein:

a powder particle diameter of said powder coating is adjusted to be 20 to 40 $\mu$m.

5. A method for manufacturing an automobile AC generator, comprising:

a step for assembling a rectifier assembly constituted by a positive heat sink assembly manufactured by mounting a plurality of positive diodes on a positive heat sink, a negative heat sink assembly manufactured by mounting a plurality of negative diodes on a negative heat sink, and a circuit board assembly;

a step for assembling said rectifier assembly to a rear bracket;

a powder coating spraying step in which said rectifier assembly and said rear bracket are grounded, and then insulating powder coating charged with a plus polarity is sprayed to said rectifier assembly and said rear bracket, whereby said insulating powder coating being absorbed onto a surface of an exposed metal of said rectifier assembly and said rear bracket by the electrostatic force; and a heating process step for heating the powder coating to be hardened, which is covered on the surface of said exposed metal.

6. A method for manufacturing an automobile AC generator as recited in claim 5, further comprising:

prior to said powder coating spraying step, a step for assembling a stator to said rear bracket, and for electrically connecting a stator coil to said stator coil connecting terminal of said rectifier assembly.

7. A method for manufacturing an automobile AC generator as recited in claim 5, further comprising:

prior to said powder coating spraying step, a step for assembling a voltage regulator and a stator to said rear bracket, for electrically connecting the voltage regulator to a voltage regulator connecting terminal of said rectifier assembly, and for electrically connecting a stator coil to said stator coil connecting terminal of said rectifier assembly.

8. A method for manufacturing an automobile AC generator as recited in claim 5 wherein:

a powder particle diameter of said powder coating is adjusted to be 20 to 40 $\mu$m.

\* \* \* \* \*